United States Patent [19]
Frazier

[11] Patent Number: 5,852,374
[45] Date of Patent: Dec. 22, 1998

[54] RESETTABLE LATCHED VOLTAGE COMPARATOR

[75] Inventor: Gary A. Frazier, Garland, Tex.

[73] Assignee: Texas Instruments Incorporated, Dallas, Tex.

[21] Appl. No.: 858,074

[22] Filed: May 16, 1997

[51] Int. Cl.$^6$ .......................... H03K 5/153; H03K 3/315
[52] U.S. Cl. ............................... 327/77; 327/80; 327/195
[58] Field of Search .................................. 327/77, 78, 80, 327/81, 82, 88, 89, 192, 193, 195, 196, 397, 402, 499, 568, 74, 75, 76, 142, 198, 498

[56] References Cited

U.S. PATENT DOCUMENTS

| | | | |
|---|---|---|---|
| 3,553,496 | 1/1971 | Weiss | 327/570 |
| 3,668,426 | 6/1972 | Culver | 327/74 |
| 4,868,418 | 9/1989 | Imamura et al. | 327/77 |
| 5,140,188 | 8/1992 | Burns | 327/78 |
| 5,721,503 | 2/1998 | Burns et al. | 327/78 |

*Primary Examiner*—Toan Tran
*Attorney, Agent, or Firm*—Christopher L. Maginniss; W. James Brady, III; Richard L. Donaldson

[57] ABSTRACT

A resettable latched voltage comparator includes a resonant tunneling diode 10 connected in series with an amplifier 14 and a power source 16, and a reset circuit 12 connected between a circuit output terminal 18 and a second power source 20. Amplifier 14 converts the value of the voltage at an input terminal 22 into a proportional current at terminal 24; diode 10 detects the condition when the current at terminal 24 rises above a specific value equal to the resonant peak current of resonant tunneling diode 10; and reset circuit 12 controllably forces the voltage at terminal 18 of the circuit to a value approximately equal to the output voltage of power source 16 at terminal 29, thereby reducing the bias across diode 10 to approximately zero. A flash analog-to-digital converter configuration includes a plurality of comparators 200$_i$ having their reference voltage inputs biased from a series-connected chain of resistors 210$_i$. The input terminals 22$_i$ of the comparators are coupled for connection to an analog signal source, and the comparator reset terminals 25$_i$ are coupled for connection to a reset control source.

15 Claims, 4 Drawing Sheets

RESETTABLE LATCHED VOLTAGE COMPARATOR

The U.S. Government has rights in this invention pursuant to Contract No. 93-F-4106, awarded by the U.S. Government.

RELATED APPLICATION

This application includes subject matter which is closely related to U.S. patent application Ser. No. 08/858,073, "Reset Circuit for Resonant Tunneling Devices and Systems," filed even date herewith.

TECHNICAL FIELD OF THE INVENTION

The present invention relates generally to electronic circuits and, more particularly, to analog-to-digital conversion circuits which utilize negative impedance devices such as resonant tunneling diodes and the like.

BACKGROUND OF THE INVENTION

Devices which convert variable signal levels into discrete, or digital, representations for use by digital signal processors have been used over the years in many forms. These devices provide an interface between electronic sensors, which have variable output values of voltage or current, and digital electronic computers. In these devices, an analog input signal is represented by an N-bit digital code word such that each code word represents a numerical approximation of the sampled analog signal at specific times.

A principal thrust of engineers in recent years has been to produce analog-to-digital conversion circuits which operate at higher speed or use less electrical operating power than earlier developed circuits. Another major emphasis of analog and digital circuit engineers has been to reduce the physical size of such circuits because size reduction generally results in lower fabrication cost, lower power consumption, and higher operating speed. However, in cases where the highest possible operating speeds is required, analog-to-digital converter devices have often required complex circuitry which consumes excessive operating power and have an associated high cost of manufacture. Therefore, continued reduction in component size and circuit size in very high speed analog-to-digital circuitry is desirable as a means to lower cost and power dissipation.

The parallel analog-to-digital (A/D) converter architecture, commonly referred in the art to as flash A/D converters, provide the fastest possible approach to representing an analog signal value by a digital word. In this circuit, one digitized sample of a continuous time varying signal is produced with N bits of resolution in each conversion cycle. The architecture relies on a "brute force" method whereby all possible quantization levels of the input signal are simultaneously compared to the analog input signal. The circuit compares $2^N$ distinct ranges of the input signal using $2^N-1$ distinct electronic comparators which are separately set to $2^N-1$ unique reference states. If the analog input signal value lies within the range of one of the $2^N-1$ comparator circuits, then that circuit changes its electrical output state from a logic "0" to a logic "1" value. Since at least one comparator is provided for all possible values of the input signal, a digital output code will be generated which is composed of a string of one or more logic "0" values and one or more logic "1" values within the digital word. A continuously operated flash A/D circuit will provide a steady stream of digital output code words that faithfully approximate the time-varying values of a signal. Generally it is the goal of the engineer to provide flash A/D circuits for digitally approximating ever faster analog signals such as radar returns, analog microwave radio frequency voice and data signals, and the electrical output of high bandwidth analog fiber optic receivers. However, flash A/D devices are limited in speed and size by the aforementioned difficulty to provide circuits which operate at very high speed and low power dissipation, and are of small size.

SUMMARY OF THE INVENTION

In view of the above mentioned difficulties, it is the primary objective of the present invention to provide a latched analog voltage comparator that can be used to provide a digital representation of a time-varying analog voltage. It is a further objective of this invention to provide a latched analog voltage comparator that can be produced using at smaller size, consume less operating power, and operate at higher speed than earlier latched voltage comparator devices. It is a further objective of this invention to provide a flash analog-to-digital quantizer circuit comprising a plurality of latched analog-to-voltage comparators.

The present invention includes a resonant tunneling diode, a reset circuit, and two voltage-controlled current sinks. The resonant tunneling diode is placed in series with the two parallel-connected current sinks. The reset circuit is placed in parallel with the resonant tunneling diode. The resonant tunneling diode has two stable operating regimes in the first quadrant of its operating characteristic. Proper input of a reference voltage to one voltage-controlled current sink and proper application of an input voltage to the other voltage-controlled current sink allows the resonant tunneling diode to switch to its high stable voltage state. Proper application of a reset signal to the reset circuit forces the resonant tunneling diode to switch to a low voltage state. The resonant tunneling diode is selected so that its switching currents lie within the compliance range of the voltage-controlled current sinks. The reset circuit is selected to guarantee that the proper application of a reset signal will return the resonant tunneling diode to its stable low voltage state regardless of the current passing through the resonant tunneling diode at the moment the reset signal is applied.

BRIEF DESCRIPTION OF THE DRAWING

The foregoing features of the present invention may be more fully understood from the following detailed description, read in conjunction with the accompanying drawings, wherein.

DESCRIPTION OF THE PREFERRED EMBODIMENT

Figure 1:
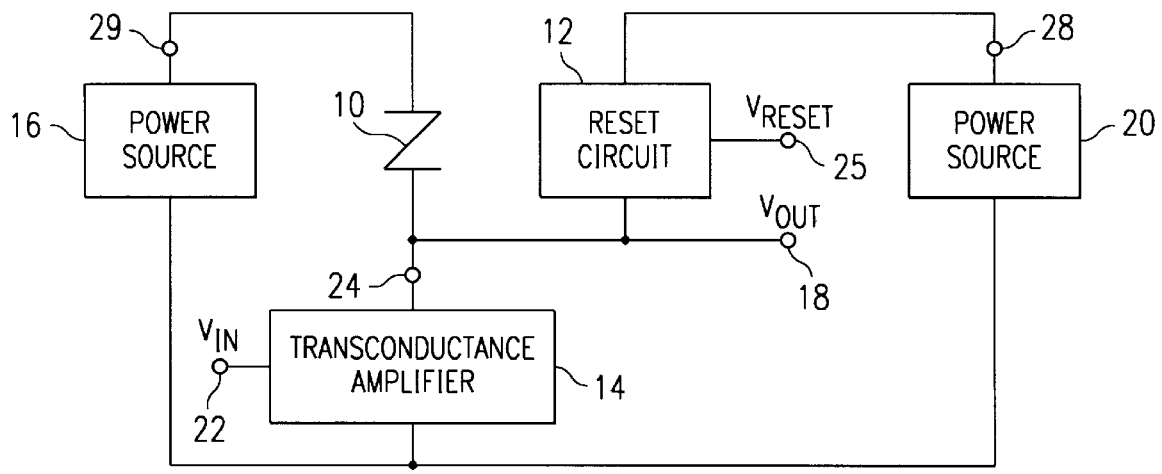
FIG. 1 illustrates a single-input resettable latched voltage comparator according to the present invention.

Referring initially to FIG. 1, there is shown a circuit including a resonant tunneling diode 10, a reset circuit 12 and a transconductance amplifier 14, configured such that resonant tunneling diode 10 is connected in series with amplifier 14 and a power source 16, and reset circuit 12 is connected between a circuit output terminal 18 and a second power source 20. Amplifier 14 converts the value of the voltage at an input terminal 22 into a proportional current at terminal 24. Resonant tunneling diode 10 is used to detect the condition when the current at terminal 24 rises above a specific value equal to the resonant peak current of resonant tunneling diode 10. Reset circuit 12 is used to controllably force the voltage at terminal 18 of the circuit to a value approximately equal to the output voltage of power source 16 at terminal 29, and thereby reduce the bias across resonant tunneling diode 10 to an approximately zero value.

Figure 2:
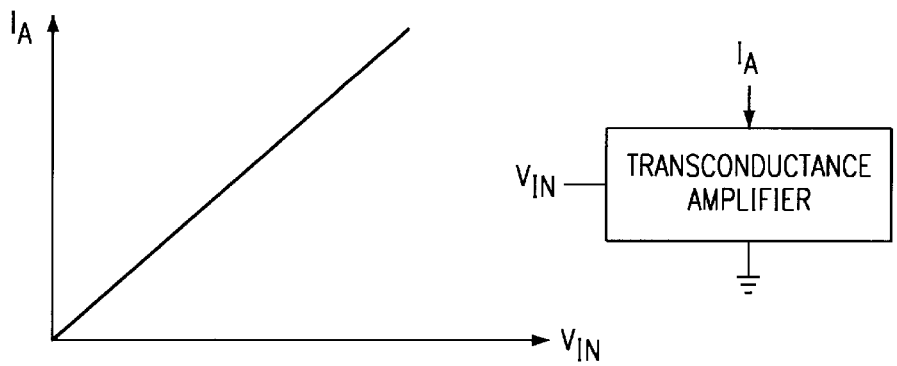
FIG. 2 illustrates the operating characteristics of a transconductance amplifier which may be of the type shown in FIG. 1.
Figure 3:
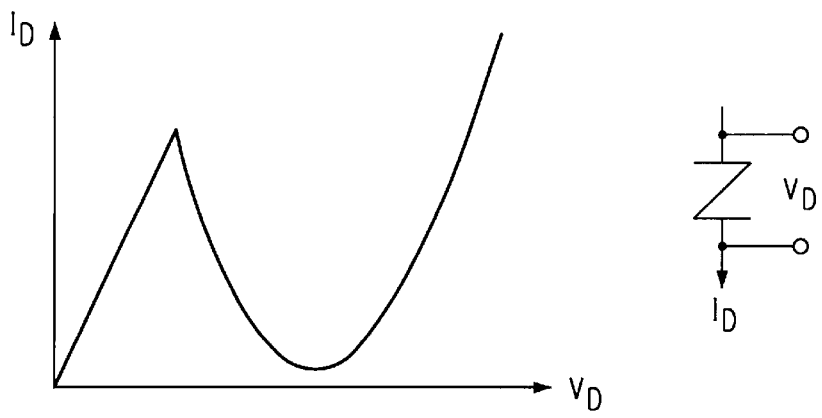
FIG. 3 illustrates the operating characteristics of a resonant tunneling diode which may be of the type shown in FIG. 1.

The desired electrical response of a transconductance amplifier, which may be amplifier 14 of FIG. 1, is illustrated in FIG. 2, and the desired electrical response of a resonant tunneling diode, which may be resonant tunneling diode 10, is illustrated in FIG. 3. The transconductance amplifier has an approximately linear response such that the current $I_A$ through the amplifier is directly proportional to the voltage $V_{IN}$ at its terminal. The resonant tunneling diode is constructed such that it provides the two-terminal current ($I_D$) vs. voltage ($V_D$) response illustrated in FIG. 3. The specific values of the current vs. voltage response of resonant tunneling diode 10 of the FIG. 1 circuit are chosen such that the peak resonant current through diode 10 is equal to the current through terminal 24 of amplifier 14 when the voltage at terminal 22 is equal to a specific value $V_{THRESHOLD}$.

Figure 4:
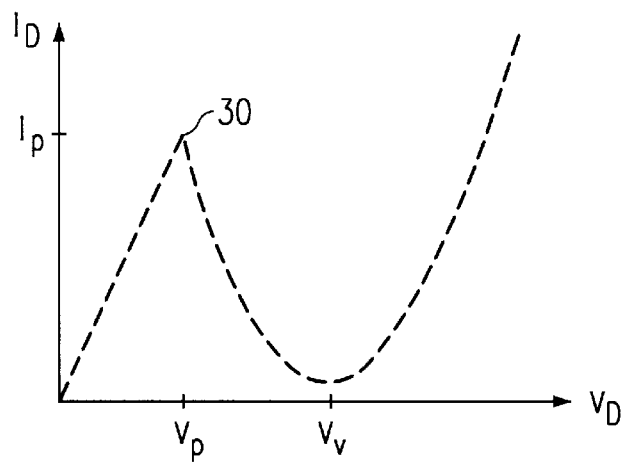
FIG. 4 illustrates the operating characteristic of a resonant tunneling diode with varying reset and input signals applied.

The manner in which the circuit of FIG. 1 operates when the reset and input voltages are applied can be understood in conjunction with FIG. 4. Initially, a voltage is applied to the control terminal 25 of reset circuit 12 sufficient to force the voltage at terminal 18 to a value approximately equal to the voltage at terminal 29 of power source 16. As a result of this action, the voltage across resonant tunneling diode 10 will drop to approximately zero volts. Subsequently, the voltage at input terminal 25 of reset circuit 12 is set to zero so that reset circuit 12 provides no current, and thus cannot change the voltage at terminal 18 of the circuit in FIG. 1. The removal of the reset signal from terminal 25 allows the voltage at terminal 18 to be controlled by the current through amplifier 14 and the electrical impedance of resonant tunneling diode 10. If, after reset, the current through amplifier 14 remains below the peak resonant current $I_p$ of diode 10, then the voltage at terminal 18 will remain at a relatively high value since diode 10 will be biased below its resonant peak voltage $V_p$ as illustrated in FIG. 4. If the current through amplifier 14 rises above the peak resonant current $I_p$ of diode 10, then the voltage at terminal 18 will drop to a relatively low voltage since diode 10 will switch to a bias state well above its resonant peak voltage $V_p$, as illustrated in FIG. 4. Once diode 10 has switched to its high voltage bias state, it will remain in this electrical state until the current through the diode is lowered below its valley current $V_v$, as indicated in FIG. 4.

The action of the reset signal is to force diode 10 to a known low voltage state, and the removal of the reset signal allows diode 10 to detect the presence of a voltage at terminal 22 that exceeds a predetermined value. If the voltage at terminal 22 exceeds the value required to cause the current through diode 10 to exceed its peak resonant current $I_p$, then diode 10 will switch states; the effect of this change of state can be observed at terminal 18. Thus, the circuit of FIG. 1 provides a resettable latched comparator of an input voltage.

Figure 5:
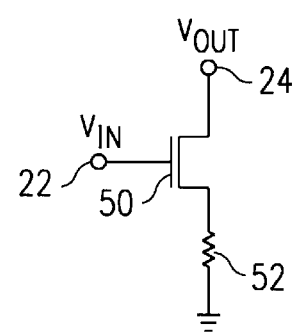
FIG. 5 illustrates a first embodiment of the transconductance amplifier of FIG. 1.
Figure 6:
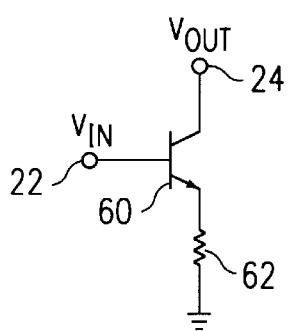
FIG. 6 illustrates a second embodiment of the transconductance amplifier of FIG. 1.

FIG. 5 shows a circuit including a field effect transistor 50 and a resistor 52 that together comprise a simple transconductance amplifier. Alternatively, the circuit in FIG. 6 illustrates the use of a bipolar transistor 60 and a resistor 62 to provide a transconductance amplifier. The use of high transconductance field effect transistors or high current gain bipolar transistors is preferred since these device will provide for a more linear conversion of voltage at terminal 22 to current into terminal 24. More elaborate circuits are well known in the art that provide a voltage-to-current response. In the circuits of FIGS. 5 and 6, the value of resistors 52 and 62 are chosen approximately equal to $V_{THRESHOLD}/I_p$, where $V_{THRESHOLD}$ is the voltage at terminal 22 above which diode 10 must switch to a high voltage bias state and $I_p$ is the peak resonant current of diode 10. A wide range of input voltages can thus be compared using the circuit of FIG. 1 by changing the values of resistors 52 or 62.

The reset circuit 12 illustrated in FIG. 1 can be provided by any circuit that has a controllable impedance such that at one value of control input, the current it provides into terminal 18 is essentially zero and such that at a second value of control input, the current into terminal 18 is sufficient to raise the voltage at terminal 18 to a level sufficient to force the diode 10 into its low bias voltage state. This state of diode 10 will occur if the voltage across diode 10 is reduced below its resonant peak voltage $V_p$. Thus, the reset circuit must have essentially no influence on the voltage at terminal 18 under one state of control and provide enough change of voltage at terminal 18 to guarantee that diode 10 always switches to its low voltage state under a second state of control.

Figure 7:
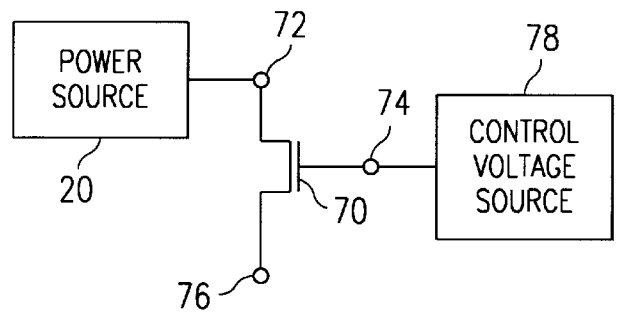
FIG. 7 illustrates a first embodiment of the reset circuit of FIG. 1.
Figure 13:
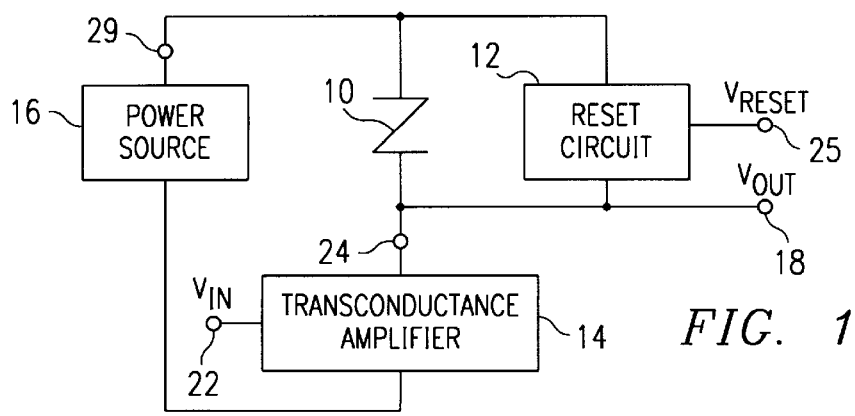
FIG. 13 illustrates an additional embodiment of the voltage comparator of the present invention.

Controllable impedance devices that can be used to reset the RTD include, but are not limited to, the following: FETs, bipolar transistors and photosensitive elements such as P-I-N diodes and photo resistors. The circuit shown in FIG. 7 illustrates how reset circuit 12 (of FIG. 1) may be provided by a single field effect transistor 70. The source electrode 76 of transistor 70 is coupled to terminal 18 of the circuit of FIG. 1, and the drain electrode 72 of transistor 70 is coupled to power source 20. The gate electrode 74, or control input, of transistor 70 is coupled to a control signal which may be the output signal of a pulse generator 78 or other source of varying voltage. In general, field effect transistors switch at higher speeds when operated at higher electrical bias between their drain and source regions. For this reason, the voltage at terminal 72 provided by power source 20 may be advantageously higher than the voltage at output terminal 29 of power source 16 (of FIG. 1). In some applications, it may be appropriate to eliminate power source 20, and to couple voltage terminal 28 to terminal 29 of power source 16 shown in FIG. 13, thereby simplifying the overall system. The choice of the type of transistor and the voltages applied by power source 20 and control voltage source 78 is determined primarily to achieve minimal effect of reset circuit 12 on the voltage at terminal 18 when in the "reset off" control condition, and primarily to guarantee that diode 10 is forced to its low voltage state in the "reset on" control condition.

Figure 8:
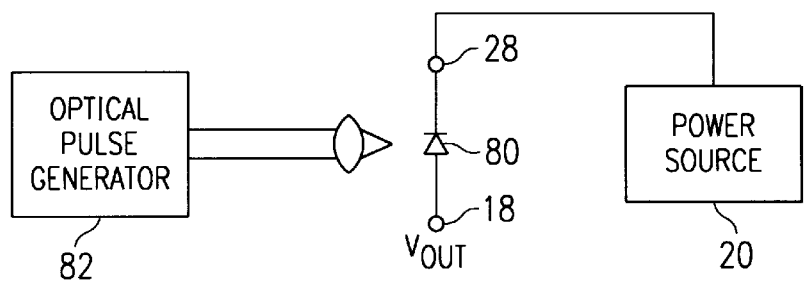
FIG. 8 illustrates a second embodiment of the reset circuit of FIG. 1.

The circuit shown in FIG. 8 illustrates how the reset circuit 12 can be provided by a photodiode 80 and optical pulse generator 82. Photodiode 80 is connected between power source 20 at terminal 28 and output terminal 18 of the circuit in FIG. 1, such that it is normally reverse-biased when no light falls onto the optically sensitive surface of photodiode 80. In this arrangement, diode 80 will be reverse-biased and allow minimal current to flow between terminals 28 and 18. Thus, with no light impinging on the photodiode, the diode implements the reset circuit in the "reset off" state. The application of a pulse or static level of optical energy to the optically sensitive surface of photodiode 80 will cause photocurrent to pass through the diode 80 between terminals 28 and 18. A sufficiently large optical energy will cause sufficient current through diode 80 such that the voltage at terminal 18 rises, forcing resonant tunneling diode 10 (of FIG. 1) to "reset" to its low voltage state.

Figure 9:
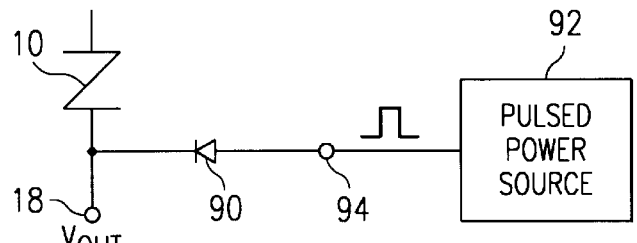
FIG. 9 illustrates a third embodiment of the reset circuit of FIG. 1.

If power supply 20 can be controlled directly, then any rectifying device such as a P-N diode can be used to provide a reset function. As shown in FIG. 9, a P-N diode 90 is connected to terminal 18 and to a pulsed power source 92. With power source 92 voltage set to a low value or zero, the P-N diode 90 is not forward biased and does not affect the voltage at terminal 18 of the circuit of FIG. 1. The occurrence of a steady state or pulsed voltage from power source 92, applied at terminal 94, which raises the voltage at terminal 18 sufficient to switch diode 10 to a low voltage state, provides the reset function to diode 10.

Figure 10:
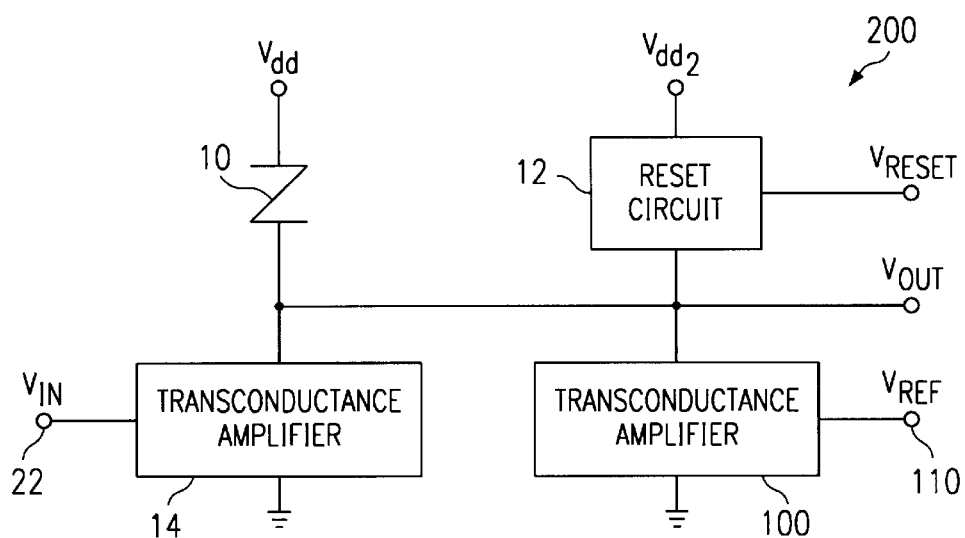
FIG. 10 illustrates a single-input resettable latched voltage comparator with reference circuit according to present invention.

In another embodiment, the circuit of FIG. 10 shows how a second transconductance amplifier 100 may be used to provide an adjustable latched voltage comparator 200. In the circuit of FIG. 1, the threshold of input voltage $V_{IN}$ which causes diode 10 to switch states is controlled by the resonant peak current $I_p$ of diode 10 and by the voltage-to-current response of the transconductance amplifier 14. In the amplifier embodiments of FIGS. 5 and 6, resistors 52 and 62, respectively, effectively set the voltage-to-current responses of the amplifiers. As a result, for a fixed diode 10 resonant peak current $I_p$, a new resistor value is required for resistor 52 or 62 to change the voltage threshold value. The second amplifier 100, of the FIG. 10 embodiment, can be preset with a reference voltage at its $V_{REF}$ terminal 110 to provide an offset current that effectively shifts the value of $V_{THRESHOLD}$.

In the operation of the circuit in FIG. 10, a voltage applied to terminal 110 of transconductance amplifier 100 establishes a steady state reference current through diode 10 when reset circuit 12 is inactive, or "off." The value of the steady state current provided by amplifier 100 is adjusted to be less than the resonant peak current $I_p$ of diode 10. This reference current will thereby reduce the additional current which must be sunk by amplifier 14 in order for the current through diode 10 to exceed $I_p$. That is, reference amplifier 100 provides a current bias to diode 10. Since amplifier 100 is a voltage-to-current converter, and since amplifier 14 operates similarly, the value of voltage at input terminal 22 required to switch diode 10 to the "high" voltage state is given by $$(I_p - B*V_{ref})/A,$$

where A is the voltage-to-current gain coefficient of amplifier 14 ($I_{in} = A*V_{in}$), and B is the voltage-to-current gain coefficient of amplifier 100 ($I_{ref} = B*V_{ref}$). It is seen from this equation that $V_{ref}$ controls the threshold voltage of latched comparator 200 in FIG. 10. As the reference current provided by amplifier 100 increases toward the value of the diode 10 resonant peak current $I_p$, proportionately less voltage at terminal 22 will be required to switch diode 10 to the "high" voltage state. Thus, the circuit of FIG. 1 will switch from a relatively high voltage on terminal 18 to a low voltage state on terminal 18 with proportionately lower voltage levels on terminal 22.

Figure 11:
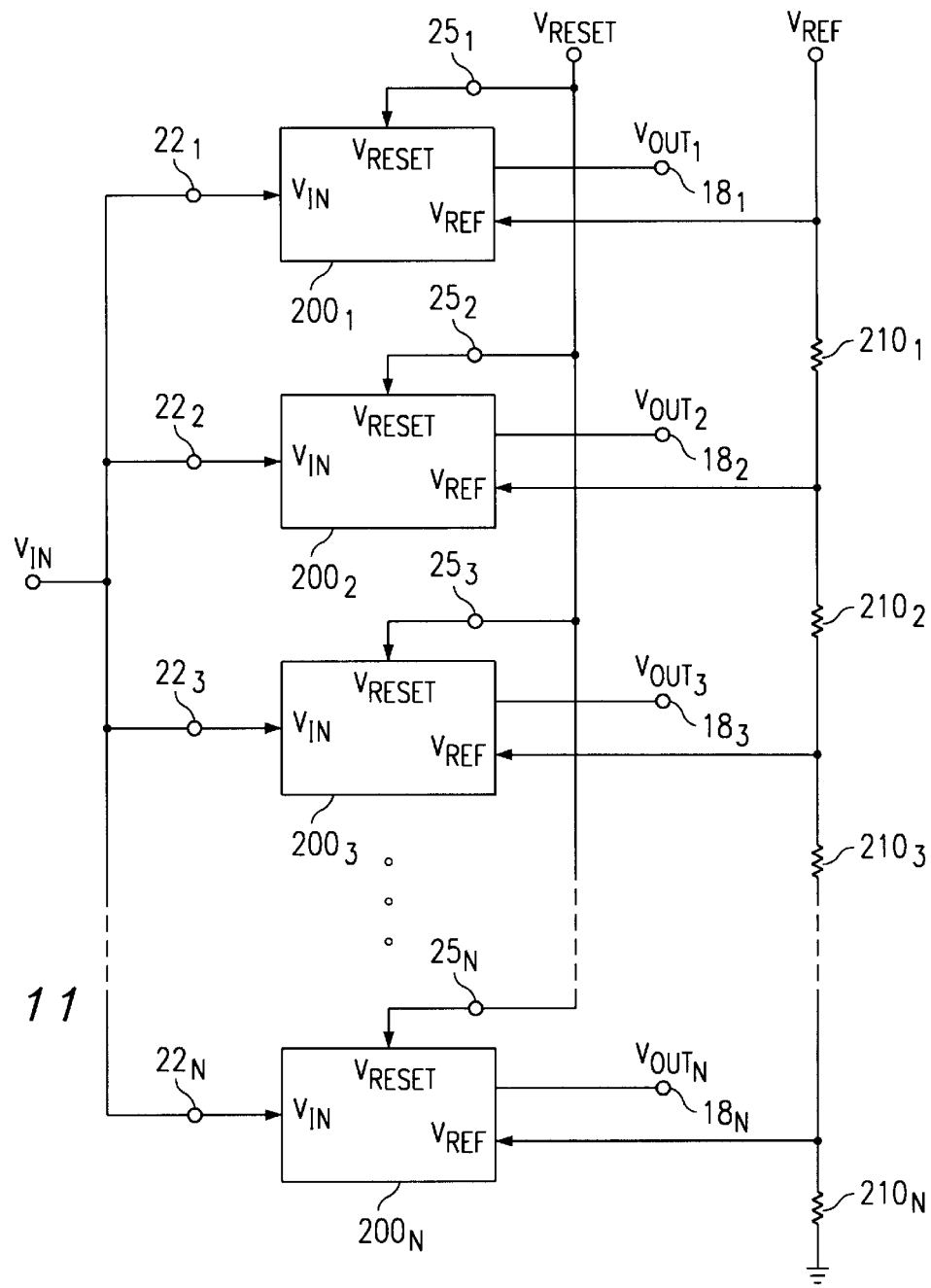
FIG. 11 illustrates a flash analog-to-digital converter including a plurality of resettable latched voltage comparators of the type shown in FIG. 10.

FIG. 11 illustrates a configuration in which a plurality of comparators $200_1, 200_2, 200_3, \ldots 200_N$, referred to collectively as comparators 200, of the type shown in FIG. 10, are combined with a plurality of resistors $210_1, 210_2, 210_3, \ldots 210_N$, referred to collectively as resistors 210, to form a flash analog-to-digital converter. The plurality of resistors 210 are connected in series and biased using a power source $V_{REF}$. With approximately identical resistors 210, a sequence of proportionately higher voltage levels will be available at the intersection of the resistors. The voltage reference ($V_{REF}$) inputs of each comparator 200 are then connected to the chain of resistors 210 such that each comparator 200 is referenced to a unique voltage level. All input terminals $22_1, 22_2, 22_3, \ldots 22_N$, of the plurality of comparators 200 are connected to a common electrical point which is suitable for connection to an input analog signal source. Similarly, all comparator reset terminals $25_1, 25_2, 25_3, \ldots 25_N$, are connected to a common electrical point which is suitable for connection to a reset control source. To operate the analog-to-digital converter of FIG. 11, a reset voltage $V_{RESET}$ is applied to terminals 25 and then removed. The analog input signal at $V_{IN}$ will then be compared against the plurality of reference levels by the plurality of comparators 200. Depending upon the reference levels, zero or more comparators 200 will switch from their reset output state to their "set" output state. The pattern of comparator output voltage levels $V_{OUT(n)}$ is directly related to the input voltage $V_{IN}$, because each comparator 200 is deterministic and the reference levels are fixed and known. Since there is a one-to-one correspondence between the resulting pattern of voltage levels on terminals $18_1, 18_2, 18_3, \ldots 18_N$, of the plurality of comparators 200 and the input voltage $V_{IN}$, the circuit of FIG. 11 provides a true converter of analog input voltages to digital output code words.

Figure 12:
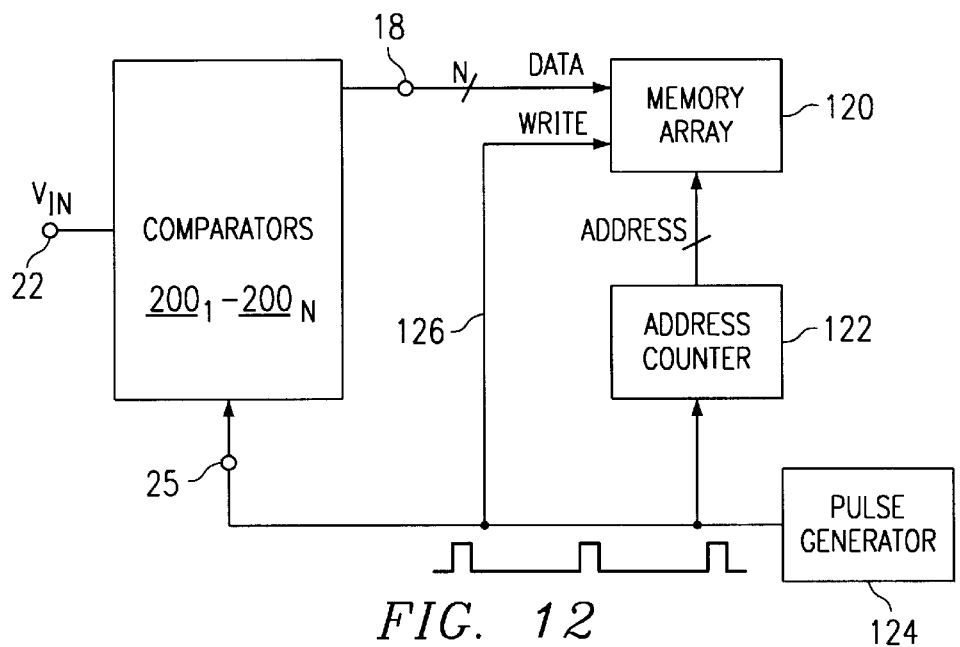
FIG. 12 illustrates an analog-to-digital converter system comprising comparators in accordance with the present invention.

FIG. 12 illustrates a typical use of the circuit of FIG. 11. A periodic sequence of reset pulses provided by a pulse generator 124 is applied to the common reset terminal 25, and simultaneously the digital word comprised of the outputs of the plurality of comparators 200 is recorded in a compatible digital memory 120. Each reset pulse places all comparators 200 into the "reset" state while also clocking the digital comparator output voltages at terminals 18 into the attached memory 120. A write line 126 into memory 120 is connected to the reset pulse stream from pulse generator 124 to synchronize the data transfer. An address counter 122 may also be incremented by the same reset pulse stream to automatically direct each subsequent digital word to a new memory location. In this particular embodiment of a complete analog-to-digital converter system, it is important that the digital data latched by the plurality of voltage comparators 200 be transferred to digital memory 120 prior to, or at the same time as, comparators 200 are reset. This can be accomplished by adjusting the temporal skew between the arrival of the reset pulse to the plurality of comparators 200 and the arrival of write signal 126 to memory array 120. One way of simplifying this timing is to use edge triggered memory cells so that the rising edge of the reset pulses causes the addressed memory cell to capture the digital input at that instant.

While the principles of the present invention have been demonstrated with particular regard to the structures disclosed herein, it will be recognized that various departures may be undertaken in the practice of the invention. The scope of the invention is not intended to be limited to the particular structures disclosed herein, but should instead be gauged by the breadth of the claims which follow.

What is claimed is:

1. A resettable latched voltage comparator for comparing an input signal to a reference potential, said comparator comprising:

a negative resistance device;

a source of said reference potential;

a voltage-controlled current sink, said current sink coupled in parallel with said source, said negative resistance device coupled in series with said current sink;

means for coupling said input signal to said current sink; and a reset circuit coupled in parallel to said negative resistance device.

2. The voltage comparator in accordance with claim 1 wherein said voltage-controlled current sink comprises a transconductance amplifier.

3. The voltage comparator in accordance with claim 2 wherein said transconductance amplifier comprises a field effect transistor having an impedance device coupled to one of its source and drain terminals.

4. The voltage comparator in accordance with claim 2 wherein said transconductance amplifier comprises a bipolar transistor having an impedance device coupled to its emitter terminal.

5. The voltage comparator in accordance with claim 1 wherein said negative resistance device is a resonant tunneling diode.

6. A resettable latched voltage comparator for comparing an input signal to a reference voltage, said comparator comprising:

a negative resistance device;

first and second voltage-controlled current sinks, said current sinks coupled in parallel to one another, said negative resistance device coupled in series with said parallel-connected current sinks;

means for coupling said input signal to one of said current sinks;

means for coupling said reference voltage to the other of said current sinks; and a reset circuit coupled in parallel to said negative resistance device.

7. The voltage comparator in accordance with claim 6 wherein at least one of said first and second voltage-controlled current sinks comprises a transconductance amplifier.

8. The voltage comparator in accordance with claim 7 wherein said transconductance amplifier comprises a field effect transistor having an impedance device coupled to one of its source and drain terminals.

9. The voltage comparator in accordance with claim 7 wherein said transconductance amplifier comprises a bipolar transistor having an impedance device coupled to its emitter terminal.

10. The voltage comparator in accordance with claim 6 wherein said negative resistance device is a resonant tunneling diode.

11. A latched analog voltage comparator for providing a digital representation of a time-varying analog signal, comprising:

a resonant tunneling diode;

a source of said reference potential;

a transconductance amplifier coupled in parallel with said source, said resonant tunneling diode coupled in series with said transconductance amplifier;

means for coupling said time-varying analog signal to said transconductance amplifier;

an output terminal coupled to said resonant tunneling diode for receiving said digital representation; and a reset circuit coupled in parallel to said resonant tunneling diode.

12. The voltage comparator in accordance with claim 11 wherein said transconductance amplifier comprises a field effect transistor having an impedance device coupled to one of its source and drain terminals.

13. The voltage comparator in accordance with claim 11 wherein said transconductance amplifier comprises a bipolar transistor having an impedance device coupled to its emitter terminal.

14. A flash analog-to-digital quantizer circuit comprising:

a plurality of resettable latched voltage comparators, each comparator comprising:
 a) a resonant tunneling diode,
 b) first and second transconductance amplifiers coupled in parallel with one another, said resonant tunneling diode coupled in series with said parallel-connected transconductance amplifiers,
 c) an output terminal coupled to said resonant tunneling diode, and
 d) a reset circuit coupled in parallel to said resonant tunneling diode;

means for coupling a time-varying analog input signal to each of said first transconductance amplifiers;

means for coupling a plurality of reference voltages individually to each of said second transconductance amplifiers; and means for providing a periodic sequences of pulses to each of said reset circuits.

15. The flash analog-to-digital quantizer circuit in accordance with claim 14 wherein said means for coupling a plurality of reference voltages individually to each of said second transconductance amplifiers comprises a chain of series-connected resistors coupled between first and second potential levels, and wherein said plurality of references voltages are obtained from the intersections of adjacent pairs of said series-connected resistors.

* * * * *